US005402084A

United States Patent [19]
Freuler et al.

[11] Patent Number: 5,402,084
[45] Date of Patent: * Mar. 28, 1995

[54] COUPLING CIRCUIT

[75] Inventors: George H. Freuler, Moreno Valley; Edward J. Collier, Anaheim; David Mazi, Moreno Valley, all of Calif.

[73] Assignee: Zero Impedance Systems, Yorba Linda, Calif.

[*] Notice: The portion of the term of this patent subsequent to Apr. 5, 2011 has been disclaimed.

[21] Appl. No.: 914,568

[22] Filed: Jul. 17, 1992

Related U.S. Application Data

[63] Continuation-in-part of Ser. No. 851,334, Mar. 16, 1992, Pat. No. 5,300,893.

[51] Int. Cl.[6] ............................................. H03F 21/00
[52] U.S. Cl. ................................. 330/146; 330/207 R
[58] Field of Search ................... 330/84, 97, 146, 297, 330/207 R

[56] References Cited

U.S. PATENT DOCUMENTS

| | | | |
|---|---|---|---|
| 2,956,236 | 10/1960 | Klestadt | 330/123 |
| 3,487,322 | 12/1969 | Ludlum | 330/297 X |
| 3,808,545 | 4/1974 | Stanley | 330/297 X |
| 4,107,619 | 8/1978 | Pass | 330/255 |
| 4,254,380 | 3/1981 | Guillen | 330/275 |
| 4,398,159 | 8/1983 | Ball et al. | 330/207 R X |
| 4,404,527 | 9/1983 | Schertz et al. | 330/84 |
| 4,560,946 | 12/1985 | Yokoyama | 330/149 |
| 4,577,160 | 3/1986 | Lettvin et al. | 330/149 |
| 4,611,180 | 9/1986 | Stanley | 330/298 |
| 4,667,166 | 5/1987 | Itoh | 330/260 |
| 4,721,919 | 1/1988 | La Rosa et al. | 330/146 |
| 4,791,381 | 12/1988 | Lenz | 330/146 X |

OTHER PUBLICATIONS

Brady, R. M. "The Floating Bridge" Wireless World, Sep. 1980 pp. 40-43.
Brady, R. M. "The Floating Bridge", Antenna (Italy), No. 2, Feb. 1981 pp. 60-63.
"High Power Auxiliary Amplifier for Automobile Application", Electronics Applications Ind. No. 237, May 15, 1977, (France).
"Handbook of Modern Electronics and Electrical Engineering"; Belove, pp. 727 & 728, 1986.

*Primary Examiner*—Steven Mottola
*Attorney, Agent, or Firm*—Spensley Horn Jubas & Lubitz

[57] ABSTRACT

A circuit for coupling a signal source producing a signal having a given voltage waveform to a load having two ends, the circuit being composed of: a load voltage control unit connectable between the signal source and one end of the load for producing across the load a voltage corresponding to the signal voltage; and a load current control unit connectable to the load and operable independently of the signal source for producing a current flow through the load sufficient to cause the voltage across the load or the current through the load to have the given waveform.

13 Claims, 4 Drawing Sheets

COUPLING CIRCUIT

CROSS REFERENCE TO RELATED APPLICATION

This application is a continuation-in-part of application Ser. No. 851,334, filed Mar. 16, 1992, now U.S. Pat. No. 5,300,893.

BACKGROUND OF THE INVENTION

The present invention relates to circuits for connecting the output terminals of a signal source across a load impedance.

The operation of many electrical and electronic systems relies on the application of a voltage across a load from a voltage source and it is recognized in the art that the performance of such systems depends on the quality of the coupling between the source and the load, i.e. the extent to which the voltage across the load corresponds to, or equals, the open circuit source voltage or an amplified version of the source voltage.

Ideal coupling would result in the appearance of a voltage, or possibly a current, exactly proportional to the open circuit source voltage across the load with respect to both time and frequency domain characteristics as the source signal.

The achievement of ideal coupling would be advantageous in many electronics systems. For example, if the signal source is an electronic or electrical circuit port, the load is an oscilloscope employed to monitor the time domain waveform of the voltage developed by the signal source and the intervening coupling medium is the oscilloscope probe and associated cabling, the oscilloscope trace will accurately reflect the waveform of the source voltage only if the voltage applied to the oscilloscope inputs is identical to the open circuit source voltage.

For many other types of electronics purposes, ideal coupling would produce optimum results. This would also be the case in a variety of audio, data transmission, communication and telecommunication systems. However, there is no known circuit arrangement which achieves perfect transfer, or ideal coupling, of the source voltage to the load.

Known coupling circuits fail to achieve ideal coupling for several reasons. Firstly, the voltage source is connected to the load via a coupling medium which has a finite impedance at any given frequency, and which will therefore be responsible for a voltage drop. Secondly, a practical voltage source behaves like an ideal voltage source in series with a source impedance. Therefore, when current is drawn from such a source, there is a voltage drop across the source resistance.

It is known to minimize source-to-load voltage drops, or signal attenuation, by the provision of an active circuit, known as an amplifier stage, between the source and load circuits. When such a circuit is used, for example when an operational amplifier is used as a unity gain voltage follower, the ratio of load voltage, $V_L$, to source voltage, $V_i$, can be expressed as follows:

$$\frac{V_L}{V_i} = A_V \left( \frac{R_{IN}}{R_{IN} + Z_i} \right) \left( \frac{Z_L}{Z_L + R_{OUT}} \right) \quad (1)$$

Where $A_V$ is the open circuit voltage gain of the amplifier stage, $R_{IN}$ is the driving point input resistance of the amplifier stage, $R_{OUT}$ is the driving point output resistance of the amplifier stage, $Z_i$ is the source impedance, and $Z_L$ is the load impedance.

If $R_{IN}$ is much greater than the absolute value of $Z_i$, the absolute value of $Z_L$ is much greater than $R_{OUT}$, and $A_V$ is approximately equal to 1, the load-to-source voltage ratio will be almost equal to unity. An ideal amplifier will have a value for $R_{IN}$ approaching infinity, a value for $R_{OUT}$ approaching zero and a value for $A_V$ substantially equal to unity.

However, practical amplifiers, when connected as a unity gain voltage follower, or amplifier, which include bipolar emitter followers and MOSFET source followers, have characteristics which are far from ideal. Emitter followers typically establish driving point input resistances that are rarely larger than a few hundred $k\omega$ and driving point output resistances that are rarely smaller than several tens of $\omega$. Additionally, their open circuit voltage gains are usually no better than 0.95. MOSFET source followers provide a reasonable approximation of an infinitely large driving point input resistance, but their output resistance can be of the order of 100 $\omega$. Moreover, the low frequency open circuit voltage gain of a MOSFET source follower can be as low as 0.75 and when compared with bipolar emitter followers, the frequency response of a MOSFET source follower is substantially inferior. Both of these types of followers have marginal high frequency response capabilities. In the case of an emitter follower circuit, the frequency response can also be significantly underdamped, which would promote circuit and system instability, particularly when the load is highly reactive.

When a signal source is coupled to a load having an impedance with a reactive component, the current through the load is out of phase with the voltage across the load. Conventional coupling devices, including conventional amplifiers and impedance buffers, can not supply the correct out-of-phase load current. As a result, when the load is reactive or has a reactive component, even the best coupling devices can not avoid distorting the signal across the load. Such distortion is particularly apparent during those portions of the signal cycle when the load current polarity is opposite to the load voltage polarity. Those in the art will recognize that the magnitude of the reactive component of a load impedance which will be undesirable is that which causes a load voltage distortion that measurably deteriorates the performance of the system in which the circuit is installed.

In addition, all coupling devices have some reactances, which may be undesired parasitic reactances, which will, in the prior art, unavoidably produce a time delay between the source voltage and the load voltage, as well as phase shifts within the coupling device which can lead to load voltage distortion.

SUMMARY OF THE INVENTION

It is an object of the present invention to provide a circuit which may be used as an impedance buffer which can provide an extremely low distortion and attenuation factor between a voltage source and a load.

Another object is to provide a circuit of this type which approximates an ideal coupling medium to a greater degree than prior art amplifier circuits.

A further object of the invention is to provide an amplifier which can achieve near ideal coupling between a source and a load.

Still another object of the invention is to provide an amplifier which achieves near ideal coupling with a structurally simple arrangement of inexpensive components.

Yet another object of the invention is to achieve real time, broadband compensation of any voltage variation and/or current phase shift between a source and any load due to inherent electrical characteristics of the coupling circuit and of the transmission channel between the source and the load.

Another object of the invention is to achieve real time, broadband insensitivity to external stimuli which may alter or affect the transfer function of the amplifier circuit and/or the load and of any transmission line connected between the load and the amplifier circuit, such external stimuli including stray fields and noise.

Yet a further object of the invention is to achieve a real time, broadband improvement of the amplifier circuit gain/phase margin, in effect compensating for the effect of a pole internal to the amplifier circuit, thereby broadening the usable bandwidth of the amplifier circuit.

Another object of the invention is to achieve real time, broadband insensitivity to amplifier circuit layout, by compensating for stray reactances inherent in the physical layout of the amplifier circuit.

The above and other objects are achieved, according to the invention, by an amplifier circuit for coupling a voltage source to a load, the load having a frequency domain transfer function with a reactive component g(s), the circuit comprising: coupling means having a frequency domain transfer function with a reactive component f(s); first connecting means for connecting the coupling means between the source and the load; compensating means having a frequency domain transfer function with a reactive component r(s); and second connecting means for connecting the compensating means to both the source and the load; wherein r(s) is at least substantially equal to $-[f(s)+g(s)]$.

Stated in other terms, the objects are achieved, according to the invention, by a circuit for coupling a signal source producing a signal having a given voltage waveform to a load having two ends, the load having an impedance, the circuit comprising:

load voltage control means connectable between the signal source and one end of the load for producing across the load a voltage corresponding to the signal voltage; and load current control means connectable to the load and operable independently of the signal source for producing a current flow through the load sufficient to cause the voltage across the load or the current through the load to have the given waveform.

Objects according to the invention are further achieved by a method for coupling the source to the load in the manner achieved by operation of the above-defined circuit.

The improvements according to the invention are thus achieved essentially by the provision of a circuit component between the point of connection of the signal source to the load a d.c. power source, the circuit component being effective to provide the correct load driving current despite the presence of reactances in the load current control means and even when the load current is out of phase with the load voltage.

DESCRIPTION OF THE PREFERRED EMBODIMENTS

Figure 1:
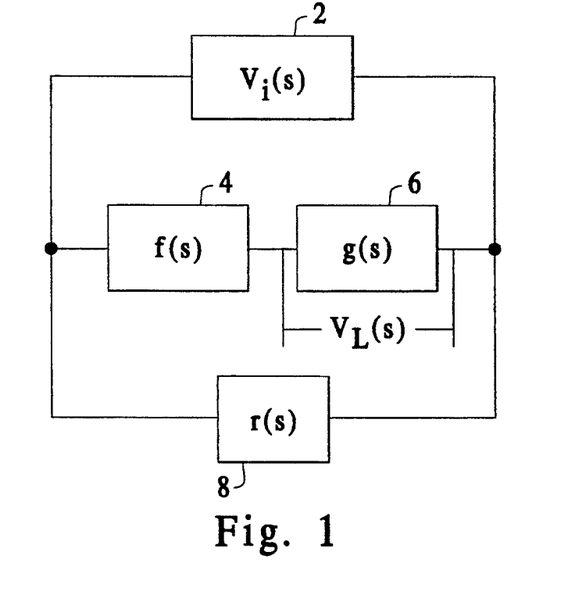
FIG. 1 is a block diagram illustrating a system for providing improved coupling in accordance with the present invention.

FIG. 1 is a block diagram illustrating a system which includes a voltage source 2, a load 6, and circuit components 4 and 8 for coupling the source to the load. Each block is represented by its Fourier transform, or frequency domain, function. Thus, voltage source 2 has the transfer function $V_i(s)$ and load 6 has the transfer function with the reactive component g(s). Conventional arrangements for coupling source 2 to load 6 would be composed of a circuit device as represented by block 4. According to principles known in the art, block 4 would be constructed to cause $V_L(s)$ to have a value as close as possible to $V_i(s)$ and to cause $V_i(s)$ to have a value as close as possible to the open circuit output voltage of source 2. However, it will unavoidably occur that the voltage coupling between source 2 and load 6 will be influenced by transfer functions with the reactive components f(s) and g(s), which will introduce some difference between the open circuit voltage provided by source 2 and $V_L(s)$.

In the prior art, efforts have been made to compensate for such difference by the provision of additional components which are capable of eliminating, or at least substantially reducing, that difference at a defined frequency.

According to the present invention, coupling unit 4 is supplemented by a waveform preservation, or compensation, element or unit 8 having the transfer function with the reactive component r(s), which is capable of substantially completely compensating for the influence of f(s) and g(s) on $V_L(s)$ over a broad frequency band. Specifically, this result will be completely achieved if:

$$r(s) = -[f(s)+g(s)].$$

The extent to which full compensation is approached is dependent on the extent to which complete equality is approached in the above-defined relationship.

Moreover, the signal frequency band over which full compensation is approached is dependent on the operating band widths of units 4 and 8. Accordingly, in preferred embodiments of the invention, unit 8 will be constructed to have an operating band width at least equal to that of unit 4.

Figure 2:
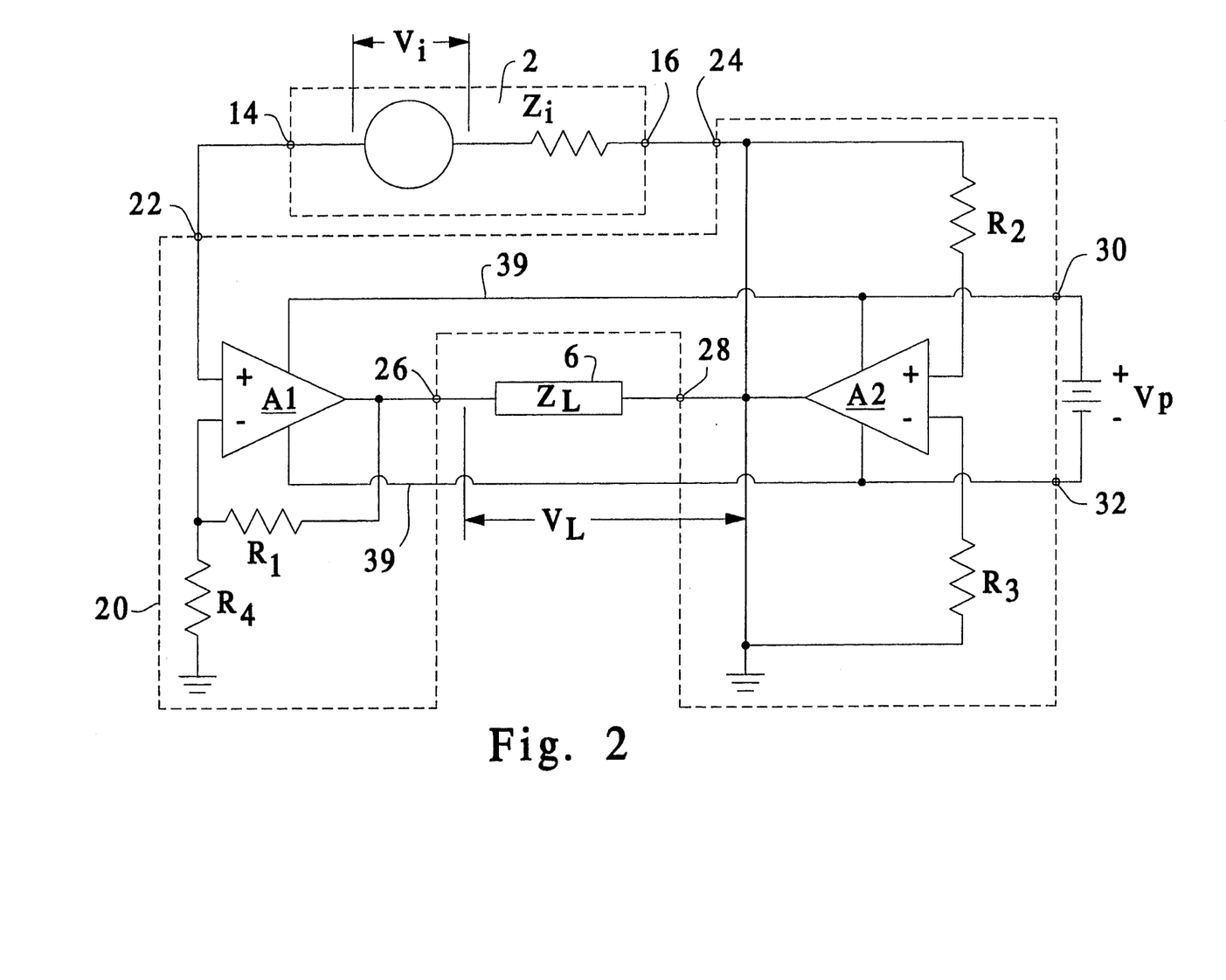
FIG. 2 is a circuit diagram illustrating a circuit according to the present invention, connected to a signal source and a load.

FIG. 2 is a circuit diagram of a preferred embodiment of an amplifier circuit according to the present invention coupling a voltage source 2 to a load 6 having an impedance $Z_L$ in such a manner that the voltage $V_L$ created across load 6 is substantially equal to the open circuit voltage $V_i$ from source 2.

Source 2 has two output terminals 14 and 16, terminal 14 being connectable to the noninverting input of a differential amplifier A1. The output of differential amplifier A1 is connectable to a first end of load 6 and to the inverting input of the same amplifier. In the illustrated embodiment, a feedback resistor $R_1$ is connected between the output of amplifier A1, and thus the first side of load 6, and the inverting input of amplifier A1 and a further resistor $R_4$ is connected between the inverting input of amplifier A1 and a point defining the reference potential for the circuit, here illustrated as ground. Amplifier A1 and resistors $R_1$ and $R_4$ here essentially correspond to device 4 of FIG. 1.

According to a particular novel feature of the invention, the amplifier circuit includes a second differential amplifier A2 whose output is connectable to both terminal 16 of source 2 and the second side of load 6. The noninverting and inverting inputs of amplifier A2 are connected via respective resistances $R_2$ and $R_3$ to the output of amplifier A2. Components A2, $R_2$ and $R_3$ essentially constitute unit 8 of FIG. 1.

Both amplifiers are preferably of a type having a high input impedance at each input, a low output impedance and a very high gain, which characteristics are provided by commercially available operational amplifiers.

The amplifier circuit is completed in a manner conventional for operational amplifiers, by a source of operating voltage, $V_p$.

According to preferred embodiments of the invention, amplifiers A1 and A2 are mounted in a housing 20 together with resistors $R_1$, $R_2$, $R_3$ and $R_4$, if such resistors are provided, and all of the conductors. The effective gain of amplifier A1, and hence the gain of the amplifier circuit, will be equal to quantity $$\frac{R_1 + R_4}{R_4},$$

or in other words, $$V_L = V_i \times \frac{R_1 + R_4}{R_4}.$$

Therefore, amplifier A1 can be configured as a unity gain voltage amplifier by making $R_4$ equal to $\infty$, i.e. by disconnecting the inverting input of amplifier A1 from the point at circuit reference potential. Associated housing 20 carries two input terminals 22 and 24, two output terminals 26 and 28 and two supply voltage terminals 30 and 32 which extend out of housing 20. Input terminal 22 is connected to the noninverting input of amplifier A1 and input terminal 24 is connected to the output of amplifier A2, while each of output terminals 26 and 28 is connected to the output of a respective one of amplifiers A1 and A2. Thus terminals 24 and 28 are shorted together. Operating voltage is supplied to both amplifiers A1 and A2 from terminals 30 and 32 via power supply conductors 39 and 39'.

Since source 2 is a voltage source, it can conventionally be thought of as a source of an EMF, $V_i$, and a series impedance $Z_i$. The voltage $V_i$ produced by source 2 would have an open-circuit value of $V_i$ and will decrease as the value of the impedance connected between output terminals 14 and 16 decreases. However, with the amplifier circuit according to the present invention, the voltage $V_L$ imposed across load 6 will remain substantially equal to $V_i$, if amplifier A1 is configured as a unity gain voltage follower, nearly independently of the value of $Z_L$.

In an amplifier circuit connected as a unity gain voltage follower according to the invention, the resistance of resistor $R_1$ can have any value between 0 and a very large value. Since the inverting input of amplifier A1 is isolated from ground, there will be virtually no current flow between the output and the inverting input of amplifier A1, so that the output and inverting input will be at the same voltage regardless of the resistance value of resistor $R_1$.

Resistances $R_2$ and $R_3$ will have low values and, according to preferred embodiments, will represent resistance values of zero ohms, i.e. both inputs of amplifier A2 are preferably conductively connected to the output of A2. The output of amplifier A2 may be connected to ground, but this is not essential. What is important is that the output of amplifier A2 provide the reference potential for both the source voltage and the load voltage, and a reference point from which to measure circuit performance. When the output of amplifier A2 is not connected to ground, the other side of resistor $R_4$ will be connected to the output of amplifier A2, but will also not be connected to ground.

When source 2 and load 6, as well as the operating voltage source, are connected as shown in FIG. 2, terminal 14 of source 2 is connected to the noninverting input of amplifier A1 and terminal 16 of voltage source 2 is connected to the output of amplifier A2. Thus, amplifier A1 is connected to operate as a voltage follower if $R_4 = \infty$. Load 6 is connected between the outputs of amplifiers A1 and A2.

With the illustrated connection arrangement, it might be thought that amplifier A2 would have no influence on the relation between $V_i$ and $V_L$. However, it has been found that, even when the inputs of amplifier A2 are connected to the output of A2 (the circuit reference point), amplifier A2 has the effect of causing the coupling between $V_i$ and $V_L$ to approach more closely an ideal coupling condition.

More specifically, amplifier A2, with its associated components, generates, or provides, the complex restoration function reactive component r(s), which has the value $-[f(s)+g(s)]$ in the equation $V_i(s)+Af(s)+g(s)+r(s)=V_L(s)$, where $V_i(s)$ and $V_L(s)$ are the frequency domain voltages provided by source 2 and generated across load 6, respectively and A is the amplifier circuit closed loop gain determined by $(R_1+R_4)/R_4$.

Each one of amplifiers A1 and A2 may be a single stage or a multistage operational amplifier. The advantage of using single stage operational amplifiers, as opposed to multistage operational amplifiers, is, in general, broader amplifier and system bandwidth. A single stage configuration also offers the advantages of circuit simplicity, with the attendant reduction in manufacturing problems, and a circuit topology which requires little compensation for broadband operation.

It should be noted that the driving point input resistance of amplifier A1 need not be extremely high to achieve a large system input resistance, given the fact that the inverting input terminal of amplifier A1 may not be returned to ground through a finite impedance if the circuit is configured as a unity gain voltage follower. Thus, the signal source is tied to a subcircuit that is effectively composed of the series combination of the driving point input resistance and, at least at low frequencies, the effective open circuit existing between the amplifier inverting input terminal and ground.

According to other embodiments of the invention, the outputs of amplifiers A1 and A2 can be connected in series with switches for controlling the connection of the output of each differential amplifier A1 and A2 to a respective end of load 6. Such switches may be employed for connecting a plurality of different loads in any desired sequence between the outputs of amplifiers A1 and A2.

Since the value of $V_L$ is virtually independent of the value of $Z_L$, the load voltage will not be affected even when the value of $Z_L$ is varying periodically or intermittently. Moreover, the value of $V_L$ will be the same for any value of $Z_L$ between purely resistive and highly reactive.

To employ an amplifier according to the invention with a signal source 2 which has one terminal grounded, the ground side of such source could be coupled to terminal 24.

While an amplifier circuit according to the invention can be connected to a floating signal source and a floating ground, and this can prove highly advantageous in certain cases, the amplifier circuit may be connected between a signal source and a load which are connected to a common ground.

It is anticipated that if an amplifier circuit according to the present invention were implemented as a monolithic integrated circuit, the cost of such circuit will be extremely low, and frequency related effects will be sharply diminished.

In view of the ability of a circuit according to the present invention to generate, in real time, the complex function reactive component r(s) which is most nearly equal to $-[f(s)+g(s)]$, a circuit according to the invention has been found to be ideally suited for transferring both analog and digital signals from a signal source to a load, particularly when the load is coupled to the output of one or both amplifiers by a transmission path having a complex transfer function.

The complex function reactive component r(s) is generated in real time and automatically by the circuit shown in FIG. 2. Furthermore, the real time generation of the complex function reactive component r(s) makes the overall amplifier circuit, which performs as a type of complex function generator, insensitive to real time disturbances in the transfer function reactive component f(s) of the coupling member and the transfer function reactive component g(s) of the load, provided that such disturbances are within the dynamic voltage, current and frequency ranges of the circuit. These ranges constitute what is here identified as the compliance region of a practical embodiment of a circuit according to the present invention.

The operating characteristics of a circuit according to the present invention, particularly in view of the action produced by amplifier A2 and its associated elements, enable the output voltage $V_L$ to be an extremely accurate representation of the voltage $V_i$, whether or not $V_L$ is an amplified version of $V_i$. In other words, the autocorrelation of $V_i(s)$ to $V_L(s)$ will approach an optimum value, virtually independently of the selected circuit gain or any amplifier circuit and transmission line propagation delays which exist.

The principle underlying the operation of circuits according to the present invention, as presently understood, will now be described in greater detail with reference to FIG. 3, which illustrates a specific embodiment of a circuit according to the invention. The embodiment shown in FIG. 3 corresponds to the components shown within housing 20 in FIG. 2, except for resistors $R_1$–$R_4$. When the embodiment shown in FIG. 3 is employed, resistors $R_1$ and $R_4$ may be connected in the manner shown in FIG. 2, while resistors $R_2$ and $R_3$ will be eliminated.

Figure 3:
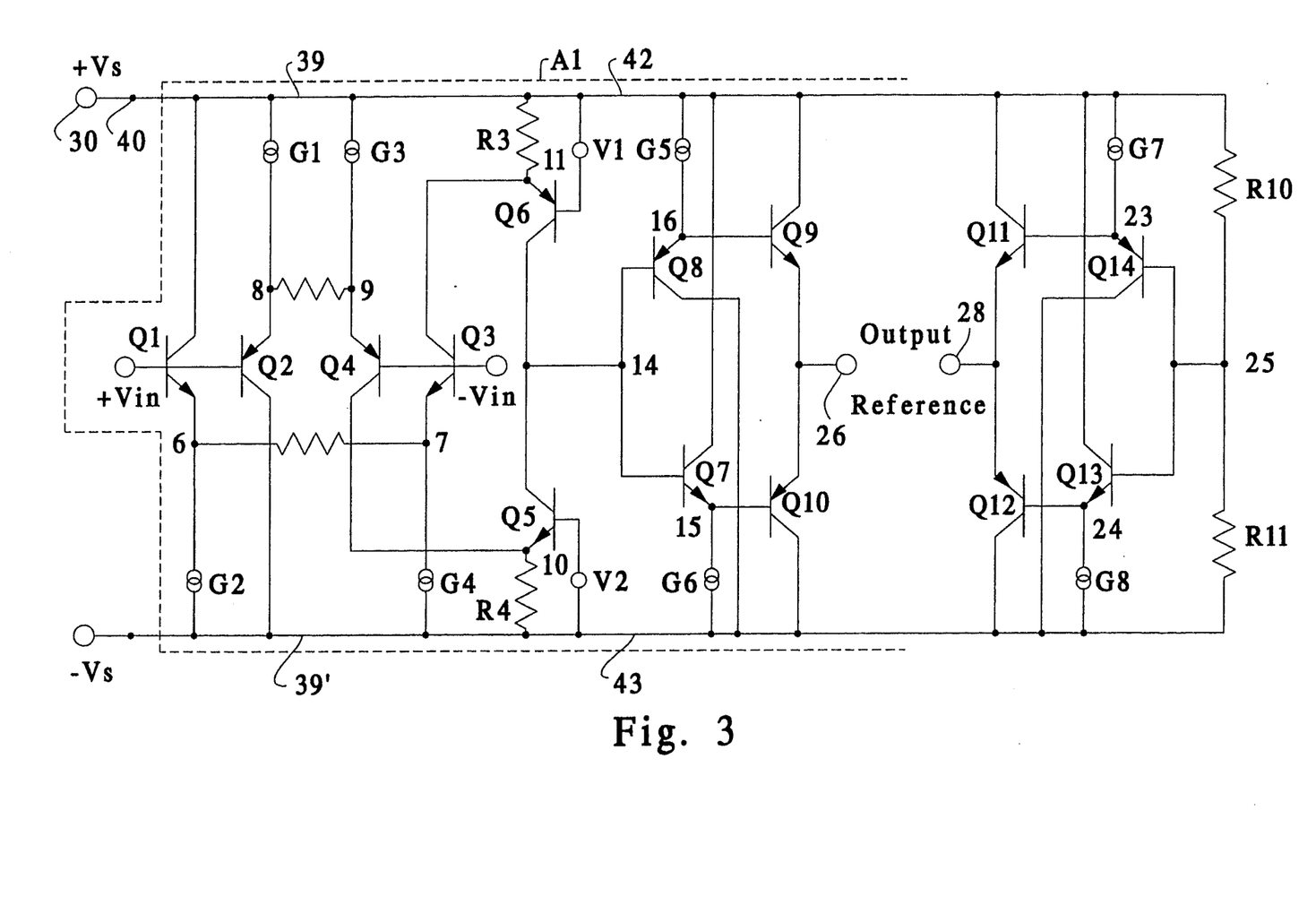
FIG. 3 is a detailed circuit diagram illustrating a preferred embodiment of the circuit according to the present invention.

In FIG. 3, operational amplifier A1 may be a model HFA-0005 amplifier manufactured and marketed by the Harris Corporation. This amplifier will be connected to a source and load in the manner shown in FIG. 2.

It has been found that the unit 8 of FIG. 1 need not be constituted by a complete operational amplifier and in the embodiment shown in FIG. 3, operational amplifier A2 is replaced by a circuit arrangement composed of transistors Q11–Q14, current sources G7 and G8 and resistors R10 and R11. Transistors Q11–Q14 and current sources G7 and G8 form a circuit arrangement which is identical to the output stage of operational amplifier A1 and may be constituted by the output stage of the model HFA-0005 amplifier. The other components of such an amplifier are replaced by resistors R10 and R11, which are connected in series between the positive and negative operating power supply terminal 30 and 32 and are connected at their point of connection to the bases of transistors Q13 and Q14. It is presently believed that resistors R10 and R11 should have identical resistance values, if a symmetrical output voltage or current swing is desired with respect to the signal reference point. The value of R10 and R11 may be adjusted to provide asymmetry if desired, as might be applicable for a digital signal.

The two bipolar output transistors Q11 and Q12 have their emitters connected together and to output 28. The collectors of transistors Q11 and Q12 are connected to respective ones of supply voltage terminals 30 and 32.

Each of transistors Q13 and Q14 has its collector-emitter path connected, in series with a respective current source G7 or G8, between supply voltage terminals 30 and 32. The base of transistor Q11 is connected to the emitter of transistor Q14 and the base of transistor Q12 is connected to the emitter of transistor Q13.

Transistors Q11 and Q12 constitute a complementary transistor pair whose emitters are connected to the point 28 which is the common terminal for the input and output signals. Transistors Q13 and Q14 are complementary to one another, transistors Q9, Q11 and Q13 are of a first conductivity type and transistors Q10, Q12 and Q14 are of the opposite conductivity type.

A key to the significant advance provided by the present invention resides in the separation of output voltage control and output current control. Output voltage control is provided by operational amplifier A1 which operates, when connected in the manner shown in FIG. 2, as a conventional voltage follower to cause $V_L$ to follow $V_i$.

According to conventional practice, an amplifier, a typical example of which is amplifier A1 of FIG. 2, would be connected by itself to source 2 and load 6, as shown in FIG. 2, and would operate as follows. If load 6 is essentially purely resistive, the current output from the amplifier will be, to a substantial degree, directly proportional to the output voltage and inversely proportional to the load resistance. The output stage of the amplifier can supply the required current within the normal limits of internal impedance, slew rate, etc. However, even with a purely resistive load, a coupling device such as amplifier A1 will, because it contains reactances which can not be eliminated, produce phase shifts between $V_i$ and $V_l$ and introduce waveform distortions in $V_L$, particularly at higher frequencies.

If the load is not purely resistive, i.e., if it has a capacitive or inductive component, or is essentially capacitive or inductive, such that the load has a complex or a reactive impedance, then current flow through the load will no longer be in phase with the voltage across the load. As a result, a certain degree of distortion will be introduced into the output voltage. Whenever the load current is out of phase with the load voltage, there will be times during each signal cycle when the polarity of the load current will have to be opposite to the polarity of the load voltage if the load voltage is not to be distorted. During those times when the current and voltage are to have respectively opposite polarities, a conventional amplifier can no longer supply the correct current and even greater waveform distortion occurs in the load. There is, however, a small current region near zero current when a very small amount of out-of-phase current can flow, but this capability of existing amplifiers is quite limited.

The preservation unit 8, constituted in the embodiment of FIG. 2 by amplifier A2 and resistors R2 and R3, and in the embodiment of FIG. 3 by the output stage components Q11-Q14, G7 and G8 along with resistors R10 and R11, provides the separate output current control which will supply the current required by load 6 to maintain the desired voltage waveform between terminals 26 and 28 despite the presence of reactances in amplifier A1 and/or a load 6 whose impedance has a reactive component.

One salient feature of circuits according to the invention is that, referring to FIG. 3, the signal common, or reference, corresponding to terminal 28, is not referenced to the ground shared by the power supply and the potential at point 28 can differ from the potential at point 25 between resistors R10 and R11.

With the addition of a waveform preservation, or compensation, unit 8 in accordance with the present invention, the operation of the system changes, although amplifier A1 continues to control the voltage across load 6 in dependance on $V_i$.

When $V_i$ has a value of zero, the reference potential at terminal 28 is essentially midway between the potentials $+Vs$ and $-Vs$ created by supply source $V_p$ at terminals 30 and 32, respectively. The potential at point 25 always has a fixed relation to the potentials on conductors 39 and 39'. At least when R10=R11, transistors Q13 and Q14 and current sources G7 and G8 act to cause the potential at point 28 to be equal to the potential at point 25 when $V_i=0$.

However, when $V_i$ has a non-zero value such that a current flows through at least partially reactive load 6, the voltage at terminal 28 varies with respect to that at point 25 between resistors R10 and R11 in accordance with the magnitude of current flow. While this variation occurs, point 25 continues to have a fixed potential relative to the supply voltage potentials. Thus, point 25 constitutes a virtual ground while point 28 corresponds to the actual circuit ground in that point 28 is common to one end of load 6 and one end of voltage source 2; it is point 28 which is connected to system ground, when connection of the circuit to system ground is desired.

But, at least when point 28 is connected to system ground, the source of operating voltage $V_p$ will not be connected to ground. The voltage between points 28 and 25 will then vary in accordance with the voltage drop expected across a pn junction in response to the current flowing through load 6.

As the potential at point 28 varies with respect to that at point 25, the potential at point 26 also varies by the same amount with respect to that at point 25 because the voltage between points 26 and 28 maintains a fixed relation to $V_i$. With respect to point 25, the potential at output point 26 is equal to the sum of the output voltage $V_L$ and the potential at point 28. Thus, the potential at output 26 changes with respect to the supply voltage potentials $+Vs$ and $-Vs$, causing a change in the bias and operating points of transistors Q9-Q12.

Specifically, the alternating voltage across the load causes the potential at terminal 28 to shift relative to the potentials at the collectors of transistors Q11 and Q12, as well as at the collectors of transistors Q9 and Q10. These potential shifts will have the following effects, when load 6 has at least a reactive component:

during parts of the signal cycle when the load current and load voltage must have the same polarity, the operating points of the currently conducting one of transistors Q9 and Q10 and that one of transistors Q11 and Q12 which is of the opposite conductivity type are shifted to produce to correct current flow between conductors 39 and 39' and through load 6. For example, during the voltage half-cycle during which transistor Q9 is being driven into conduction, transistor Q12 will also be conductive;

during those parts of the signal cycle when the load current and the load voltage must have respectively opposite polarities, the resulting shifts in the potentials at points 26 and 28 relative to point 25 will additionally drive the other two transistors, i.e. in the example described above transistors Q10 and Q11, into conduction to supply the required opposite polarity current.

In addition, if load 6 could, under existing signal conditions, be considered purely resistive, the circuit according to the invention will eliminate output voltage phase shifts and distortion that would otherwise be caused by reactances in amplifier A1. In this case, because of the effect of those reactances, the potentials at points 26 and 28 will shift to set the operating points of the conductive output transistors, i.e. either Q9 and Q12 or Q10 and Q11, to produce the load current flow needed to compensate for such reactances.

The biassing of transistors Q9-Q12 will automatically be at the levels required to generate the correct current flow.

In particular, the potential at point 26 relative to point 25 varies in a manner to follow, or conform to, the current demand. When considered with respect to point 25, the voltage of point 26 appears to be precisely in phase with the current, when the required current is flowing and as long as the circuit according to the invention is operating within its compliance limits. Current technology enables such compliance limits to be quite large.

Thus, the operation of the waveform preservation unit according to the invention to supply the required current level is relatively decoupled from the operation of the voltage control section, constituted essentially by amplifier A1. Current control is achieved by shifting the potential at reference point 28 and thus also at output point 26, relative to the supply voltage potentials +Vs and −Vs.

It has been found that a circuit according to the invention will eliminate virtually all distortion in the load current waveform, relative to the source signal voltage waveform, over substantially the entire design bandwidth of the coupling device, even for those periods when the desired load current polarity is opposite to the desired load voltage polarity. Moreover, the circuit according to the invention eliminates virtually all phase shift between the source voltage and the load voltage which would otherwise be caused by the load reactance and by reactances, including parasitic reactances, within the coupling device itself, i.e. within amplifier A1 of FIGS. 2 and 3. Reactances within the preservation unit i.e. A2 in FIG. 2 and Q11, Q14, G7, G8, R10 and R11 in FIG. 3, will not have any influence on circuit operation within the compliance region of the preservation unit, which region can be made to correspond to the design bandwidth of the coupling device.

In addition, the circuit according to the invention will effectively suppress crosstalk from adjacent circuits within the signal bandwidth of the circuit.

For many applications, it is not desirable to have the voltage at the signal common point 28 vary with respect to the power supply potentials because this could interfere with the possibility of driving a plurality of circuits according to the present invention with a single power supply. Thus, if it is desired to have a plurality of circuit devices driven by a common power supply and share the same signal reference point 28, it is possible to provide each device with an internal floating power supply that is effectively decoupled from the main, external, supply.

Figure 4:
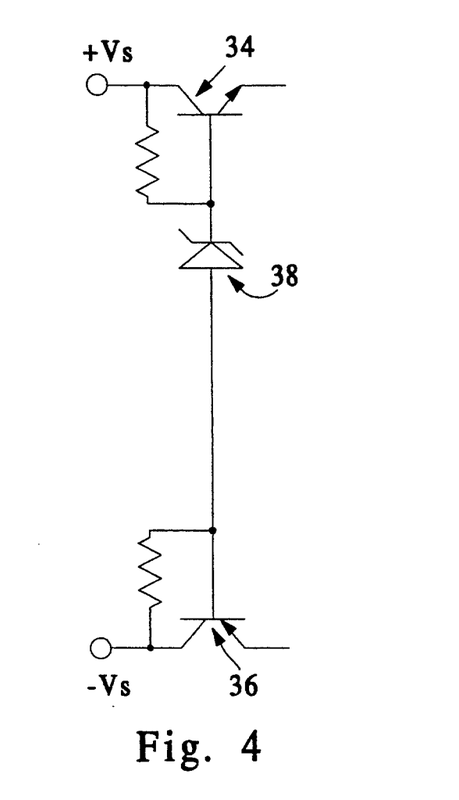
FIG. 4 is a circuit diagram illustrating a supplemental circuit unit which can be added to the circuit of FIG. 3.

One circuit arrangement for achieving this result, according to the present invention, is shown in FIG. 4. This arrangement includes two transistors 34 and 36, each having its collector connected to a respective power supply terminal. A Zener diode 38 is connected between the bases of transistors 34 and 36, with a respective biasing resistor being connected between the base and collector of each transistor 34, 36. Transistors 34 and 36 are thus connected in a common base configuration and can isolate the power supply conditions of one circuit from that of the other circuits. In the circuit arrangement shown in FIG. 4, it will be noted that transistors 34 and 36 are complementary to one another.

To employ the arrangement of FIG. 4 in the circuit of FIG. 3, the power supply conductors 39 and 39′ of the circuit of FIG. 3 may be broken at points 40 and 41, the emitters of respective transistors 34, 36 will be connected to respective points 40 and 41 and the collectors of transistors 34, 36 will be connected to terminals 30 and 32, respectively. Alternatively, the conductors could be broken at 42 and 43 and the collector-emitter path of each transistor 34, 36 may be inserted at that point in a respective conductor. +Vs and -Vs could continue to be supplied at any point of each supply conductor to the left of transistors 34 and 36. In general, transistors 34, 36 may be inserted into conductors 39 and 39′ at any points to the left of the connection points of the collectors of transistors Q9 and Q10. Therefore, the collectors of transistors Q9 and A11 will always be at the same potential, as will the collectors of transistors Q10 and Q12.

Zener diode 38 provides a reference voltage to establish the actual regulated supply voltage within a respective circuit. Transistors 34 and 36 conduct the operating current needed by the circuit portion downstream thereof.

With the circuit arrangement of FIG. 4, there is no fixed power supply ground for circuit portions to the right of transistors 34, 36 in FIG. 3. The difference between the positive and the negative power supply potentials within a device is controlled by Zener diode 38, but the potentials on the power supply lines within the circuit are free to float with respect to the potentials +Vs and −Vs. Therefore, the main external power supply may itself have a center ground, while supplying power to a plurality of circuits such that in each circuit, the potential at point 25 may shift relative to system ground.

Since the internal power supplies are decoupled from one circuit to another, the potentials at points 25 of respective circuits can vary relative to one another, even if points 28 of all circuits are conductively connected together. As a result, a group of such circuits may be connected together like conventional buffers while the benefits of the present invention are retained.

The embodiment described thus far operates to maintain identity between the waveform of the voltage across the load and the waveform of the signal voltage, $V_i$. However, there are circuit applications in which it is desirable to cause the waveform of the current through the load to be identical to the signal voltage waveform. An embodiment of the invention for achieving this relationship is illustrated in FIG. 5.

Figure 5:
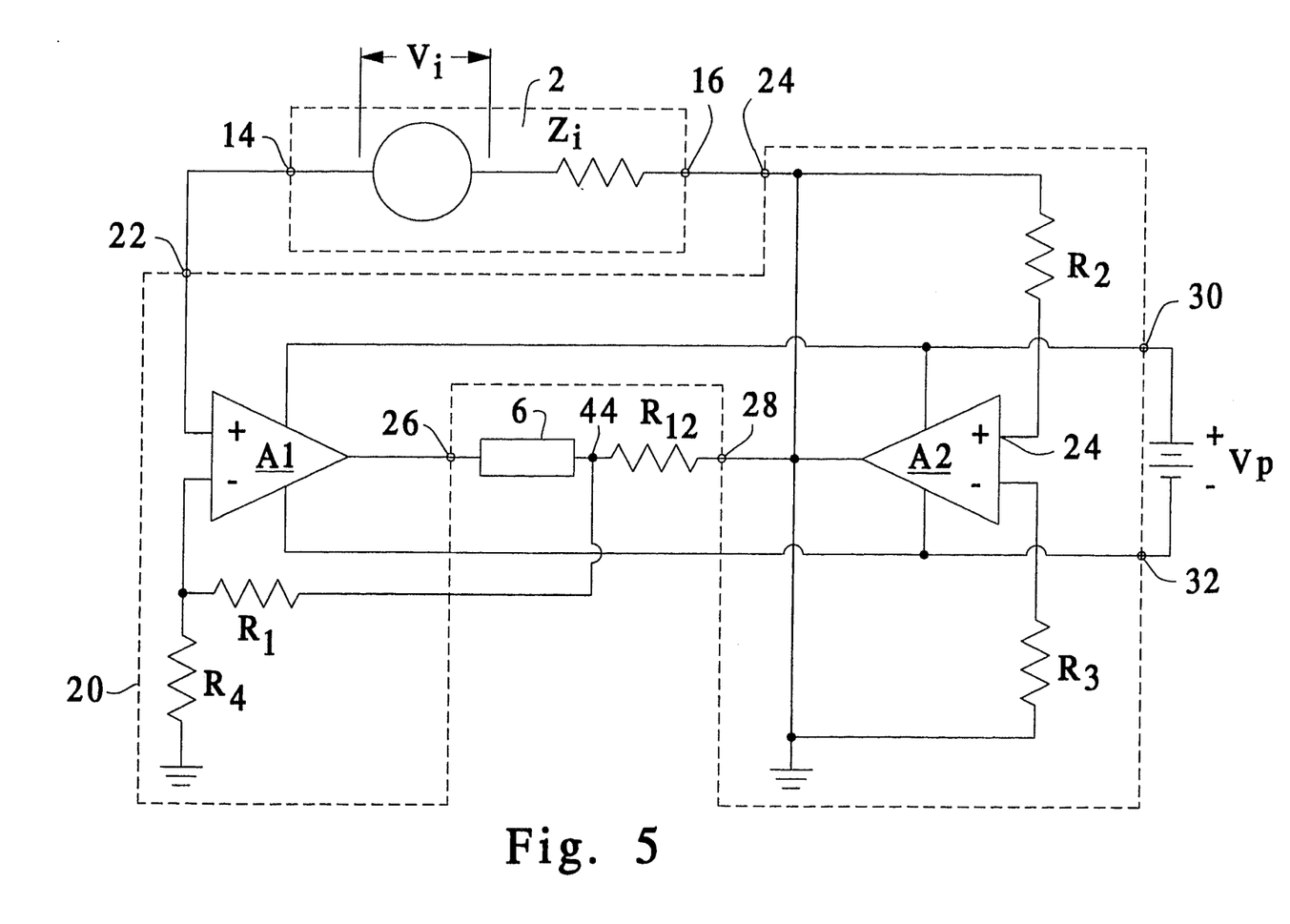
FIG. 5 is a circuit diagram similar to that of FIG. 2 illustrating a further embodiment of a circuit according to the invention for driving a reactive load in a manner to cause the current through the load to have a waveform identical to that of the signal source voltage.

The circuit shown in FIG. 5 corresponds substantially to that of FIG. 2 and the identical portions of the circuit of FIG. 5 will not be described again. The circuit of FIG. 5 differs from that of FIG. 2 in that a further resistor R12 is interposed between load 6 and reference terminal 28 and the feedback path to the inverting input of amplifier A1 is connected to the point of connection 44 between load 6 and resistor R12.

In the operation of the arrangement shown in FIG. 5, the voltage across resistor R12 will be made to follow $V_i$. Since the voltage across a resistor is always in phase with the current through the resistor, the waveform of the current flow through resistor R12 will be identical to the waveform of $V_i$. With resistor R12 connected in series with load 6, the current through load 6 will be identical to the current through resistor R12.

The resistance value of resistor R12 may be selected on the basis of the desired relationship between $V_i$ and the current through load 6.

Correspondingly, in the embodiment shown in FIG. 3, load 6 and resistor R12 would be connected in series between terminals 26 and 28 and point 44 would be connected, via resistor R1, to the base of transistor Q3.

A circuit according to the invention may be employed in virtually any type of electronics system, including analog and digital communication systems, analog and digital process control systems, navigation systems, radar systems, medical monitoring systems, etc. Examples of communication systems include broadcast systems for radio and television signals, audio systems, video systems, telephone networks, microwave transmission systems, satellite communication systems, etc. In any system of the type mentioned above, any amplifier stage or buffer stage may be constituted by an embodiment of a circuit according to the present invention.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A circuit for coupling a signal source producing a signal having a voltage with a given waveform to a load having two ends, the load having an impedance, said circuit comprising:

operating power supply means having a power supply conductor;

load voltage control means connected to the power supply conductor to receive operating power and connectable between the signal source and one end of the load for producing across the load a voltage corresponding to the signal voltage; and load current control means connected to the power supply conductor to receive operating power and connectable to the load and forming a controllable current flow path with the load that provides a variable current which produces a current flow through the load sufficient to cause one of the voltage across the load and the current through the load to have the given waveform.

2. A circuit as defined in claim 1 wherein said load current control means comprise a high gain operational amplifier having a noninverting input connectable to the source and an output connectable to the source and to one end of the load.

3. A circuit as defined in claim 1 wherein said load voltage control means and said load current control means comprise operating power supply means having two conductors each providing a respective potential such that a selected voltage exists between said conductors, and said load current control means comprises a first pair of current flow control elements each having a current flow path with a controllable impedance, said current flow paths being connected together at a point which is connectable to the other end of the load and being connected in series between said two conductors.

4. A circuit as defined in claim 3 wherein said first pair of current flow control elements are mutually complementary transistors.

5. A circuit as defined in claim 4 wherein said load voltage control means include an output stage comprising a second pair of mutually complementary transistors each having a current flow path with a controllable impedance, said current flow paths of said second pair of transistors being connected together at a point which is connectable to the one end of the load and being connected in series between said two conductors.

6. A circuit as defined in claim 3 wherein said operating power supply means further comprise: an operating voltage source having two output connections providing potentials having respectively opposite polarities relative to ground, and isolating means coupling said output connections to said conductors in a manner to isolate said conductors from ground.

7. An amplifier circuit for coupling a voltage source to a load, the load having a frequency domain transfer function with a reactive component g(s), said circuit comprising: coupling means having a frequency domain transfer function with a reactive component f(s); first connecting means for connecting said coupling means between the source and the load; compensating means having a frequency domain transfer function with a reactive component r(s); and second connecting means for connecting said compensating means to both the source and the load; wherein r(s) is at least substantially equal to $-[f(s)+g(s)]$.

8. A circuit as defined in claim 7 wherein: the voltage source has first and second output terminals and the load has first and second ends; said coupling means comprise differential amplifying means having first and second inputs, an output and means for generating a voltage at said output which is proportional to the difference in potential at said first and second inputs, said first input being connected to said first connecting means for connection to the first output terminal of the source, said output being connected to said first connecting means for connection to the first end of the load, and said second input being connected to said output; and said compensating means comprise second amplifying means having at least one input, an output and means for establishing a high voltage gain between said input and said output, said output of said second amplifying means being connected to said second connecting means for connection to the second output terminal of the source and to the second end of the load.

9. A circuit as defined in claim 8 wherein said differential amplifying means is a high gain operational amplifier having a noninverting input constituting said first input and an inverting input constituting said second input.

10. A circuit as defined in claim 9 in combination with a voltage source having first and second output terminals, said first output terminal being connected to said noninverting input of said operational amplifier and said second output terminal being connected to said output of said second amplifying means, and a load impedance having first and second ends each connected to the output of a respective one of said amplifying means.

11. A circuit as defined in claim 8 wherein said coupling means further comprise a first resistor connected in series between said output and said inverting input of said operational amplifier and a second resistor connected in series between said inverting input of said operational amplifier and said output of said second amplifying means, whereby the effective gain of said operational amplifier is determined by the ratio of the sum of the resistances of said first and second resistors to the resistance of said second resistor.

12. A circuit as defined in claim 8, further comprising: a housing containing said amplifying means; first and second input terminals extending out of said housing, said first input terminal being connected to said one input of said differential amplifying means and said second input terminal being connected to said output of said second amplifying means; and first and second output terminals extending out of said housing, each said output terminal of said circuit being connected to said output of a respective one of said amplifying means.

13. A circuit as defined in claim 8 wherein each said amplifying means has an operating bandwidth, and the operating bandwidth of said second amplifying means is at least as large as that of said differential amplifying means.

* * * * *